(12) United States Patent
Nishitsuji

(10) Patent No.: US 6,352,889 B1
(45) Date of Patent: Mar. 5, 2002

(54) METHOD FOR FABRICATING CAPACITOR AND METHOD FOR FABRICATING SEMICONDUCTOR DEVICE

(75) Inventor: Mitsuru Nishitsuji, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/225,560

(22) Filed: Jan. 5, 1999

(30) Foreign Application Priority Data

Jan. 8, 1998 (JP) .......................................... 10-002231

(51) Int. Cl.$^7$ ...................... H01L 21/8242; H01L 21/20
(52) U.S. Cl. ...................... 438/240; 438/250; 438/253; 438/393; 438/396; 438/785
(58) Field of Search ........................... 438/3, 240, 250, 438/253, 393, 396, 785

(56) References Cited

U.S. PATENT DOCUMENTS

| | | | | |
|---|---|---|---|---|
| 4,710,478 A | * | 12/1987 | Yoder et al. ................. | 438/169 |
| 4,789,645 A | * | 12/1988 | Calviello et al. ............ | 438/167 |
| 4,876,176 A | * | 10/1989 | Calviello et al. ............ | 430/311 |
| 4,959,705 A | * | 9/1990 | Lemnios et al. ............. | 257/532 |
| 5,227,323 A | * | 7/1993 | Nishitsuji et al. ........... | 438/396 |
| 5,356,831 A | * | 10/1994 | Calviello et al. ............ | 117/105 |
| 5,728,603 A | * | 3/1998 | Emesh et al. .................. | 438/3 |
| 5,811,847 A | * | 9/1998 | Joshi et al. .................. | 257/296 |
| 5,929,473 A | * | 7/1999 | Nishihori et al. ............ | 257/277 |

FOREIGN PATENT DOCUMENTS

| | | |
|---|---|---|
| JP | 03080562 | 5/1991 |
| JP | 4-354879 | 12/1992 |
| JP | 4-357869 | 12/1992 |
| JP | 5-114697 | 5/1993 |
| JP | 5-116913 | 5/1993 |
| JP | 6-163527 | 6/1994 |
| JP | 7-176704 | 7/1995 |
| JP | 7-226485 | 8/1995 |
| JP | 8-045925 | 2/1996 |
| JP | 408045925 B2 * | 2/1996 ....... H01L/21/8242 |
| JP | 8-274256 | 10/1996 |
| JP | 9-252085 | 9/1997 |
| JP | 10-247724 | 9/1998 |

OTHER PUBLICATIONS

J. Lee., et al., "Effect of $O_2$/Ar ratui abd Annealing on the Properties of (Ba,Sr) $TiO_3$ Films Prepared by RF magnetron Sputtering", Jpn. H. Appl. Phys. vol. 35 (1007), Part 1, No. 6A, pp. 3644–3648, Jun. 1997.

M. Itsumi, et al., "On–Chip Decoupling Capacitance with High Dielectric Constant and Strength Using $SrTiO_3$ Thin Films Electron–Cyclotron–Resonance–Sputtered at 400°C", Electrochem. Soc. vol. 144, No. 12, pp. 4321–43254, Dec. 1997.

* cited by examiner

*Primary Examiner*—Stephen D. Meier
*Assistant Examiner*—Toniae M. Thomas
(74) *Attorney, Agent, or Firm*—McDermott, Will & Emery

(57) ABSTRACT

A method for fabricating a capacitor according to the present invention includes the steps of: forming a lower-level electrode layer over a structure having thermally deteriorative properties; depositing an insulating film, containing a titanium oxide, on the lower-level electrode layer at a deposition temperature of 400° C. or less; conducting a heat treatment at a temperature higher than the deposition temperature and lower than 500° C. after the insulating film has been deposited; and depositing an upper-level electrode layer on the insulating film after the heat treatment has been conducted.

9 Claims, 8 Drawing Sheets

↑
No Treatment

METHOD FOR FABRICATING CAPACITOR AND METHOD FOR FABRICATING SEMICONDUCTOR DEVICE

BACKGROUND OF THE INVENTION

The present invention relates to a method for fabricating a capacitor including an insulating film, containing a titanium oxide, as a capacitive insulating film and a method for fabricating a semiconductor device including such a capacitor. More particularly, the present invention relates to respective methods for fabricating capacitor and semiconductor device using strontium titanate deposited at 400° C. or less.

First, known methods for depositing an insulating film containing a titanium oxide will be described. In this specification, strontium titanate is exemplified as a typical material for an insulating film containing a titanium oxide. According to reported methods, strontium titanate is deposited by metalorganic chemical vapor deposition (MOCVD), sputtering, sol-gel process or the like.

The relative dielectric constant of a strontium titanate film (at 100 or more) is larger than that of an SiN film or an $SiO_2$ film. Accordingly, if a strontium titanate film is used as a capacitive insulating film for a capacitor, then the capacitance per unit area can be increased. In view of this advantage, the application of a strontium titanate film to a capacitor for a DRAM or a microwave monolithic IC (MMIC) requiring a high degree of integration is now under consideration.

In the field of mobile communication, the frequency range applicable to MMIC's is expected to expand from the vicinity of 1 GHz for cellular phones to reach an even higher frequency in the near future. Thus, a capacitor, having capacitance (e.g., 10 pF or more) large enough to ground a circuit at a radio frequency, needs to be integrated with an IC so as to occupy as small an area of the IC as possible. Also, in order to operate a field effect transistor at a radio frequency, a compound semiconductor substrate including an active layer formed by epitaxy (hereinafter, such a substrate will be referred to as an "epitaxial substrate") should be desirably used for the active region of the transistor. This is because if an FET is formed by ion implantation, the resulting thickness of the channel region thereof and the concentration of the dopants implanted thereto are limited and not suitable for high-speed operation.

Taking these factors into consideration, the integration of a large-capacitance capacitor on an epitaxial substrate has increased its importance for the implementation of an MMIC operative at a radio frequency. However, an epitaxial substrate is thermally unstable, and therefore poorly resistant to a heat treatment conducted at a temperature higher than the epitaxy temperature thereof. Also, in a substrate in which a plurality of layers have been formed by heteroepitaxy from dissimilar materials, the heat treatment should be performed at a temperature low enough to suppress the deterioration at the heterojunctions thereof owing to thermal counter diffusion. Accordingly, in order to suppress the deterioration of a thermally unstable epitaxial substrate, a strontium titanate film should be desirably deposited at a lower temperature for a shorter period of time.

However, if a strontium titanate film is deposited at a temperature lower than the epitaxy temperature thereof by the prior art techniques, the following various problems happen.

In accordance with an MOCVD technique, organic metals supplied do not thermally decompose at a lower temperature and therefore films of excellent quality cannot be obtained. Thus, if a strontium titanate film is to be deposited by a conventional MOCVD technique, then the temperature of the substrate should be held at about 650° C. during the deposition.

According to a sol-gel process, a coated film is crystallized while the sintering temperature is ordinarily set at about 800° C. If the sintering temperature is lowered, however, the molten sources of strontium and titanium are not sufficiently crystallized. Thus, it is difficult to obtain a high-quality film.

Because of these reasons, RF sputtering is currently used in most cases for the deposition of a strontium titanate film on an epitaxial substrate.

With an RF sputtering technique, the deposition rate of a strontium titanate film is proportional to RF power applied. Nevertheless, if the RF power density is excessive, then the strontium titanate target cannot be cooled sufficiently. As a result, the target is damaged. Since it is hard to apply excessively high RF power, the deposition rate of a strontium titanate film cannot be increased satisfactorily. In addition, if extraordinarily high RF power is applied, then the properties of the epitaxial substrate deteriorate owing to the damage resulting from sputtering. Accordingly, during the deposition of a strontium titanate film, RF power applied cannot exceed a certain value, which requires a long time to deposit the strontium titanate film. The deposition process takes such a long time in accordance with RF sputtering. Thus, the deposition temperature should be even lowered so as not to deteriorate the properties of the epitaxial substrate. Nevertheless, if the deposition temperature is lowered, then the relative dielectric constant of the strontium titanate film deposited adversely decreases. A film having a low relative dielectric constant is not qualified as a capacitive insulating film for a capacitor.

The same argument can be constructed whenever a substrate or an integrated circuit has a structure with thermally deteriorative properties, even if an epitaxial substrate is not used.

SUMMARY OF THE INVENTION

A prime object of the present invention is to provide a method for fabricating a capacitor, in which a titanium oxide insulating film showing a high relative dielectric constant can be formed on a structure with thermally deteriorative properties, like an epitaxial substrate, while suppressing such deterioration.

A method for fabricating a capacitor according to the present invention includes the steps of: forming a lower-level electrode layer over a structure having thermally deteriorative properties; depositing an insulating film, containing a titanium oxide, on the lower-level electrode layer at a deposition temperature of 400° C. or less; conducting a heat treatment at a temperature higher than the deposition temperature and lower than 500° C. after the insulating film has been deposited; and depositing an upper-level electrode layer on the insulating film after the heat treatment has been conducted.

Another method for fabricating a capacitor according to the present invention includes the steps of: forming a lower-level electrode layer over a structure having thermally deteriorative properties; depositing an insulating film, containing a titanium oxide, on the lower-level electrode layer at a deposition temperature of 400° C. or less; depositing an upper-level electrode layer on the insulating film; and conducting a heat treatment at a temperature higher than the deposition temperature of the insulating film and lower than 500° C.

Still another method for fabricating a capacitor according to the present invention includes the steps of: forming a lower-level electrode layer over a structure having thermally deteriorative properties; depositing an insulating film, containing a titanium oxide, on the lower-level electrode layer at a deposition temperature of 400° C. or less; depositing an upper-level electrode layer on the insulating film; working the upper-level electrode layer; and conducting a heat treatment at a temperature higher than the deposition temperature of the insulating film and lower than 500° C.

Yet another method for fabricating a capacitor according to the present invention includes the steps of: forming a lower-level electrode layer over a structure having thermally deteriorative properties; depositing an insulating film, containing a titanium oxide, on the lower-level electrode layer at a deposition temperature of 400° C. or less; working the insulating film into a desired capacitor shape; conducting a heat treatment at a temperature higher than the deposition temperature of the insulating film and lower than 500° C.; and forming an upper-level electrode layer on the insulating film.

In accordance with the present invention, a method for fabricating a semiconductor device, including a transistor and a capacitor on an epitaxial substrate, is also provided. The process of fabricating the capacitor includes the steps of: forming a lower-level electrode layer over an epitaxial substrate; depositing an insulating film, containing a titanium oxide, on the lower-level electrode layer at a deposition temperature of 400° C. or less; and depositing an upper-level electrode layer on the insulating film. A heat treatment is conducted at a temperature higher than the deposition temperature and lower than 500° C. after the insulating film has been deposited and before the upper-level electrode layer is deposited.

DESCRIPTION OF THE PREFERRED EMBODIMENTS

Figure 1:
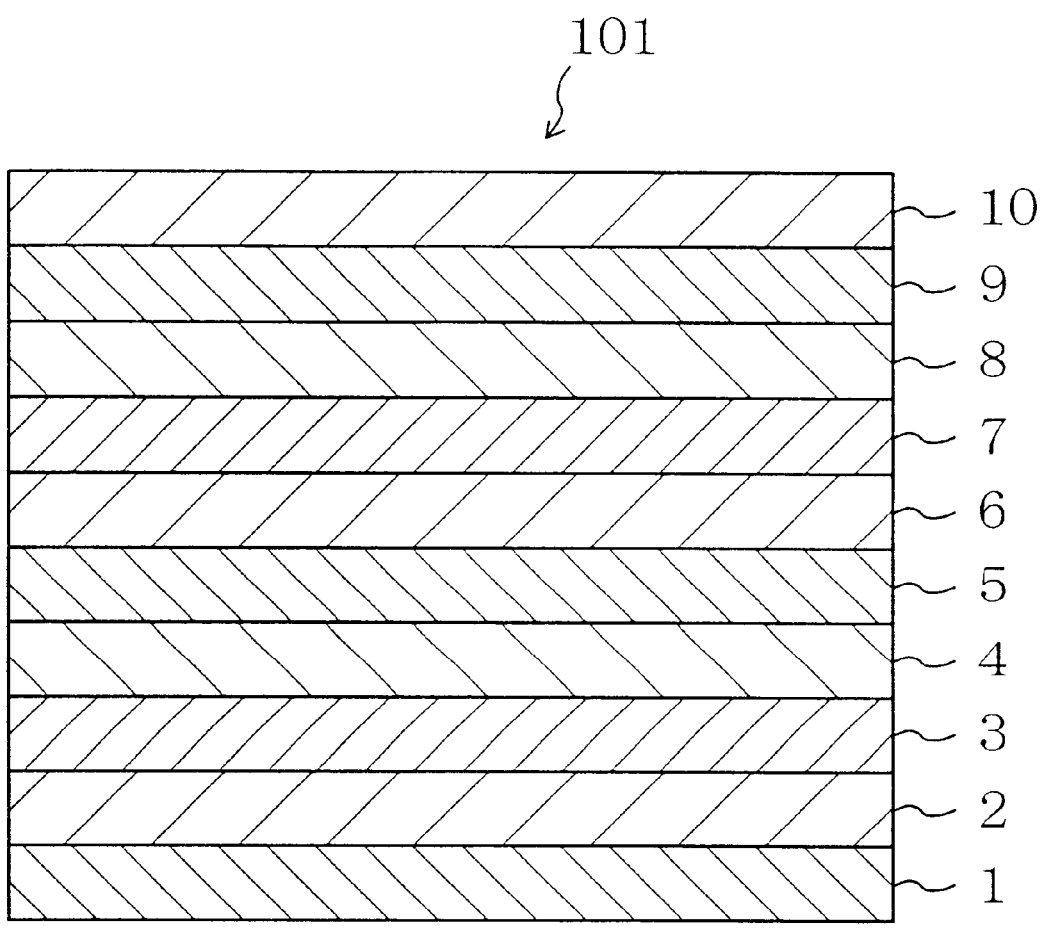
FIG. 1 is a cross-sectional view illustrating a structure of an epitaxial substrate used in the preferred embodiments of the present invention.

FIG. 1 schematically illustrates the cross-sectional structure of a compound semiconductor substrate 101 used in the preferred embodiments of the present invention. This compound semiconductor substrate 101 includes a plurality of epitaxial layers including an active layer, and therefore will be called an "epitaxial substrate" in this specification. As shown in FIG. 1, this epitaxial substrate 101 includes a semi-insulating GaAs substrate 1 and a semiconductor multilayer structure formed on the substrate 1. The semiconductor multilayer structure includes: a buffer layer 2 (thickness: 600 nm); an i-type $Al_{0.2}Ga_{0.8}As$ layer 3 (thickness: 200 nm); an n-type $Al_{0.2}Ga_{0.8}As$ layer 4 (thickness: 5 nm); an i-type $Al_{0.2}Ga_{0.8}As$ spacer layer 5 (thickness: 5 nm); an i-type $In_{0.2}Ga_{0.8}As$ active layer 6 (thickness: 10 nm); an i-type $Al_{0.2}Ga_{0.8}As$ spacer layer 7 (thickness: 5 nm); an n-type $Al_{0.2}Ga_{0.8}As$ layer 8 (thickness: 5 nm); an i-type $Al_{0.2}Ga_{0.8}As$ layer 9 (thickness: 10 nm); and an n-type GaAs layer 10 (thickness: 30 nm). All of these layers have been epitaxially grown and stacked in this order on the semi-insulating GaAs substrate 1. It is noted that the epitaxial substrate 101 may include a patterned epitaxial layer or a non-epitaxial layer such as an amorphous insulating layer. Furthermore, the epitaxial substrate 101 may also incorporate a circuit component, such as a transistor, performing various types of electrical functions. The point is that the epitaxial substrate 101 is a structure having thermally deteriorative properties. As can be seen, an "epitaxial substrate" broadly encompasses substrates of various types in this specification.

Figure 2:
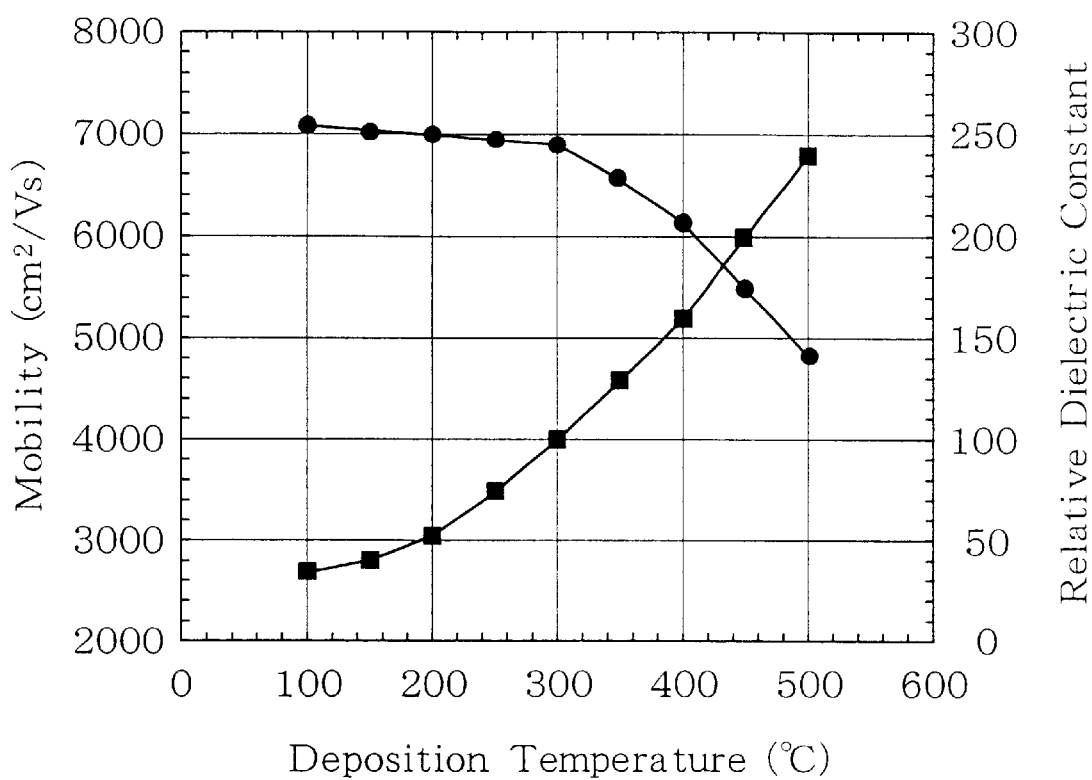
FIG. 2 is a graph illustrating relationships between the temperature at which a strontium titanate film has been deposited and the mobility of carriers in an active layer of an epitaxial substrate and between the deposition temperature and the relative dielectric constant.

FIG. 2 illustrates a relationship between the mobility of carriers in the active layer 6 of the epitaxial substrate 101 and the temperature at which a strontium titanate film has been deposited by RF sputtering on the epitaxial substrate 101 shown in FIG. 1.

As indicated by the plot identified with ● in FIG. 2, the mobility of carriers starts to decrease in the active layer at a deposition temperature of 300° C. While the deposition temperature is in the approximate range from 300° C. to 400° C., the mobility is within the range of about 90% to about 100% of that at 300° C. or less. However, once the deposition temperature exceeds 400° C., the mobility decreases more remarkably. Accordingly, in order to maintain a high carrier mobility, the deposition temperature is preferably set at 400° C. or less, more preferably 300° C. or less. The lower limit of a preferable temperature range is approximately equal to room temperature. Although it is not impossible to deposit the film at a temperature lower than room temperature, a special cooling system is required in such a case, and therefore such a low temperature is not preferred. On the other hand, as represented by the relationship between the relative dielectric constant and the deposition temperature of the strontium titanate film (indicated by the plot identified with ■ in FIG. 2), the lower the deposition temperature is, the lower the relative dielectric constant of the as-deposited film is.

According to the present invention, after a strontium titanate film has been deposited at a temperature in the approximate range from room temperature to 400 ° C., a heat treatment is conducted at a temperature higher than the deposition temperature of the strontium titanate film and lower than 500° C., thereby increasing the relative dielectric constant of the strontium titanate film. That is to say, during the deposition of the strontium titanate film taking a long time, the temperature of the substrate is held relatively low, thereby suppressing the thermal deterioration in properties of the substrate (e.g., an epitaxial substrate). And then, a heat treatment is conducted at a relatively high temperature for a shorter period of time so as to increase the relative dielectric constant of the film. In this manner, the crystallization of a strontium titanate film can be promoted and a capacitor including a strontium titanate film having a high relative dielectric constant can be formed without deteriorating the properties of the substrate.

Embodiment 1

Hereinafter, an exemplary method for fabricating a capacitor according to an embodiment of the present invention will be described with reference to FIGS. 3A through 3E.

Figure 3A:
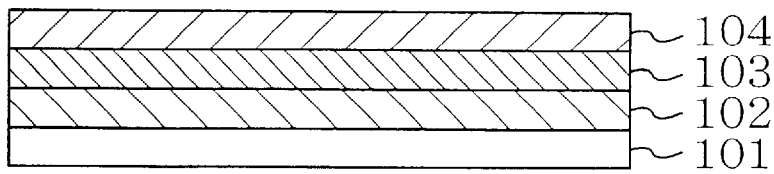
FIGS. 3A through 3E are cross-sectional views illustrating respective process steps for fabricating a capacitor according to a first embodiment of the present invention.

First, as shown in FIG. 3A, a lower-level electrode layer 103 (thickness: 300 nm) is evaporated over an SiN protective film 102 (thickness: 300 nm) formed on an epitaxial substrate 101, and then a strontium titanate film 104 (thickness: 300 nm) is deposited thereon at 300° C. The deposition time is about 90 minutes. The thickness of the strontium titanate film 104 is preferably 200 nm or more in order to maintain high insulation properties. The lower-level electrode layer 103 may be made of Ti/Pt layers. In this embodiment, a substrate having an AlGaAs/InGaAs/AlGaAs double heterostructure shown in FIG. 1 is used as the epitaxial substrate 101.

The relative dielectric constant of the as-deposited strontium titanate film 104 is as low as about 100, which is not qualified for a capacitive insulating film. As a result of this deposition process step, the properties of the epitaxial substrate 101 are not deteriorated, and the mobility of carriers in the active layer (identified by the reference numeral 6 in FIG. 1) is as high as about 7,000 $cm^2Vs$.

Figure 3B:
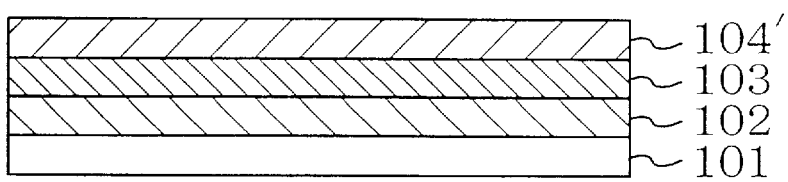

Next, as shown in FIG. 3B, a heat treatment is conducted at 450° C. for 10 minutes. An inert gas or an oxidizing gas is used as the ambient of the heat treatment. Nitrogen or argon is preferably used as the inert gas and oxygen is preferably used as the oxidizing gas. As a result of this heat treatment, the strontium titanate film 104 is recrystallized to be a more orderly oriented strontium titanate film 104' having a higher relative dielectric constant, which reaches as high as about 160. In addition, even after the heat treatment has been conducted at a relatively high temperature of 450° C., the mobility of carriers in the epitaxial substrate 101 is still kept almost as high as that before the treatment. This is because the heat treatment is conducted for a relatively short time. In other words, the properties of the epitaxial substrate 101 are hardly deteriorated as a result of this heat treatment.

Figure 3C:
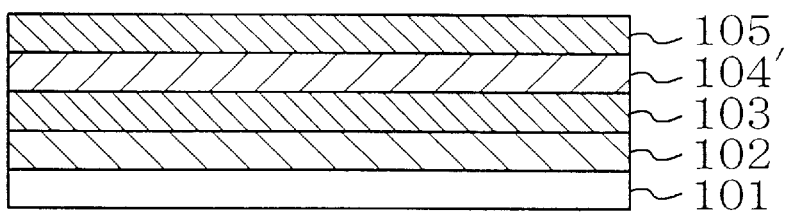
Figure 3D:
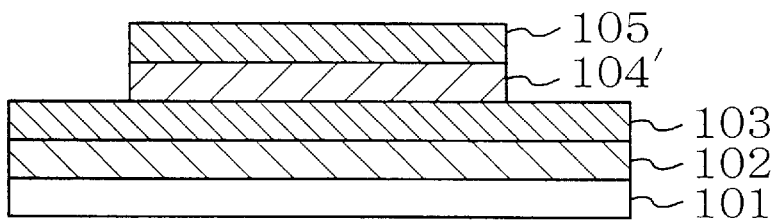

Thereafter, as shown in FIG. 3C, a metal film made of platinum (Pt) is deposited as an upper-level electrode layer 105 (thickness: 100 nm) on the strontium titanate film 104'. Then, as shown in FIG. 3D, the upper-level electrode layer 105 and the strontium titanate film 104' are patterned by known lithography and etching techniques.

Figure 3E:
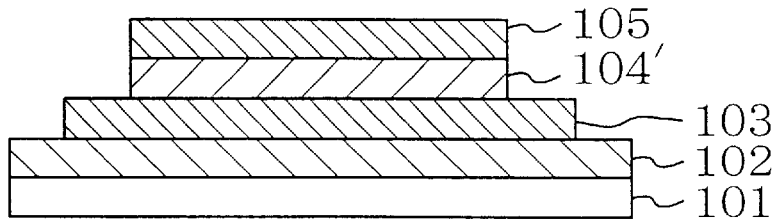

Subsequently, as shown in FIG. 3E, the lower-level electrode layer 103 is also patterned by known lithography and etching techniques to complete a capacitor having a three-level structure consisting of lower-level electrode, capacitive insulating film and upper-level electrode. Only a single capacitor is illustrated in FIG. 3E. However, in actuality, a plurality of capacitors may be formed simultaneously on a single epitaxial substrate 101 during this process step.

The relative dielectric constant of the capacitive insulating film (i.e., the strontium titanate film 104') formed by the method of this embodiment is 160 as already mentioned. If such a high relative dielectric constant is to be attained by a conventional method, then the strontium titanate film 104' must be deposited at a temperature as high as about 420° C. In such a case, the properties of the epitaxial substrate 101 never fail to deteriorate during the deposition. In contrast, in accordance with the method of this embodiment, the deterioration in properties of the substrate can be suppressed and yet a capacitor having a high relative dielectric constant can be integrated.

In this embodiment, a heat treatment is conducted before the upper-level electrode layer 105 is deposited and patterned. Instead, the heat treatment may be conducted at 450° C. for 10 minutes after the upper-level electrode layer 105 has been patterned. The same effects can also be attained in such an alternate embodiment.

Figure 4:
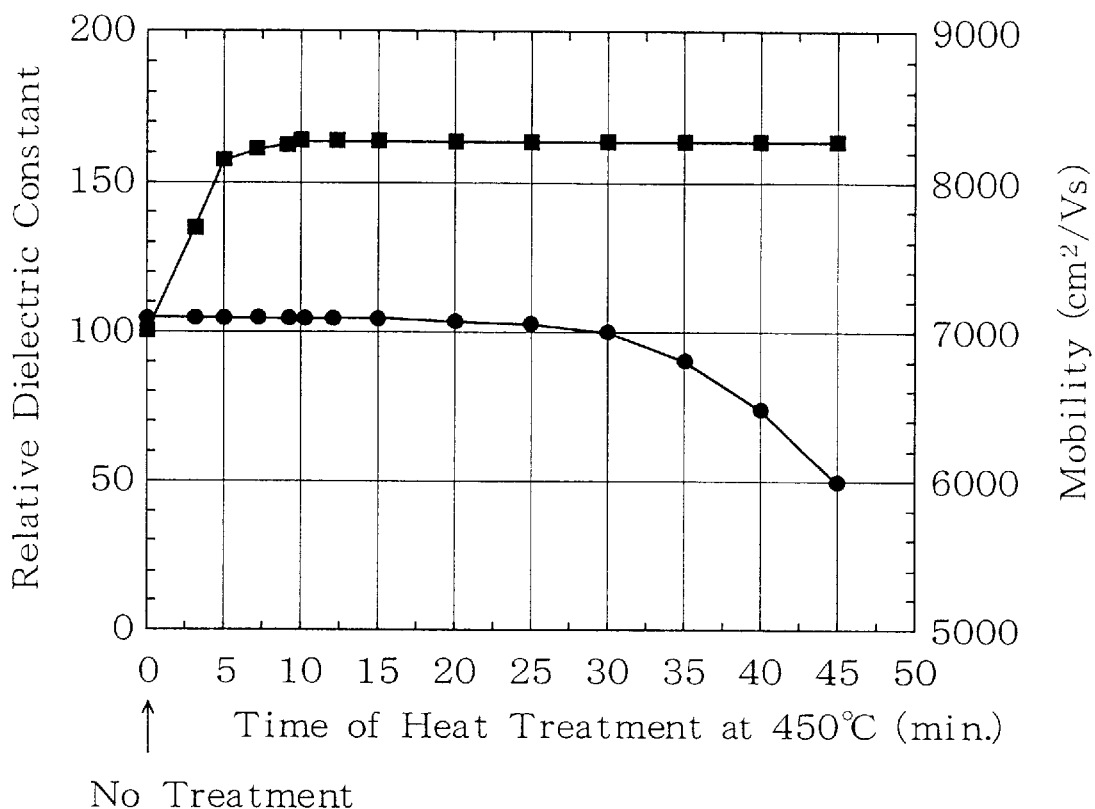
FIG. 4 is a graph illustrating the dependence of the relative dielectric constant of a strontium titanate capacitor on the amount of time for which a heat treatment is conducted at 450° C.

FIG. 4 illustrates a variation in relative dielectric constant with the amount of time for which a heat treatment is conducted at 450° C. (represented by the plot identified with ■). The mobility of carriers in the epitaxial substrate 101 after the heat treatment has been conducted is also plotted in FIG. 4 (identified with ●). As can be understood from FIG. 4, if the heat treatment is conducted for 5 minutes or more, a substantially constant high relative dielectric constant can be attained. As also seen from FIG. 4, if the heat treatment time is 30 minutes or more, the mobility abruptly decreases. Accordingly, when the heat treatment is conducted at about 450° C., the heat treatment is preferably conducted for 5 to 30 minutes, both inclusive.

Embodiment 2

Hereinafter, another exemplary method for fabricating a capacitor according to a second embodiment of the present invention will be described with reference to FIGS. 5A through 5E.

Figure 5A:
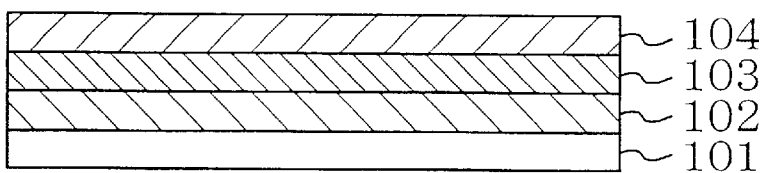
FIGS. 5A through 5E are cross-sectional views illustrating respective process steps for fabricating a capacitor according to a second embodiment of the present invention.

First, as shown in FIG. 5A, a lower-level electrode layer 103 (thickness: 300 nm) is evaporated over an SiN protective film 102 (thickness: 300 nm) formed on an epitaxial substrate 101, and then a strontium titanate film 104 (thickness: 300 nm) is deposited thereon at 300° C. The deposition time is about 90 minutes. The thickness of the strontium titanate film 104 is preferably 200 nm or more in order to maintain high insulation properties. The lower-level electrode layer 103 may be made of Ti/Pt layers. In this embodiment, a substrate having an AlGaAs/InGaAs/AlGaAs double heterostructure shown in FIG. 1 is also used as the epitaxial substrate 101.

Figure 5B:
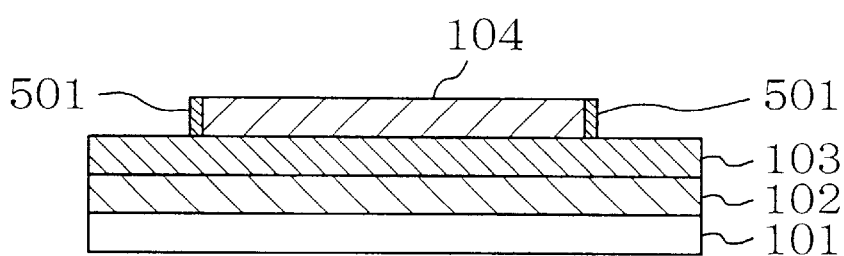

Next, as shown in FIG. 5B, the strontium titanate film 104 is patterned by known lithography and etching techniques. A wrought face 501 formed by patterning the strontium titanate 104 is illustrated in FIG. 5B. If this patterning is performed by a dry etching technique, a large number of crystal imperfections must have been formed in the wrought face 501 owing to the damage caused by etching.

Figure 5C:
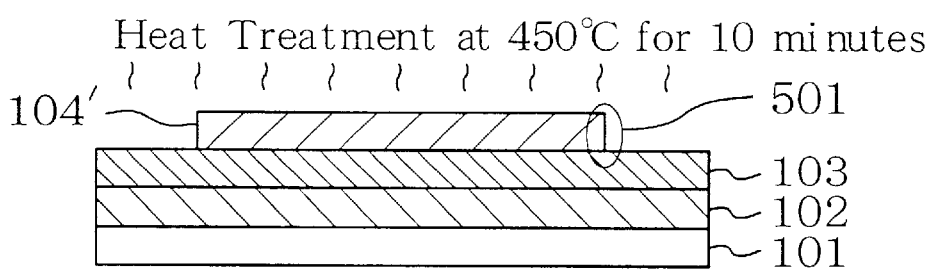

Thereafter, as shown in FIG. 5C, a heat treatment is conducted at 450° C. for 10 minutes. An inert gas or an oxidizing gas is used as the ambient of the heat treatment. As a result of this heat treatment, the crystalline orientation of the strontium titanate film 104 patterned changes and the film 104 is turned into a strontium titanate film 104' having a higher relative dielectric constant. In addition, the wrought face 501 has also recovered from the crystal imperfections. Although this heat treatment is conducted at a relatively high temperature of 450° C., the time period of the heat treatment is relatively short (10 minutes). Accordingly, the properties of the epitaxial substrate 101 are hardly deteriorated as a result of the heat treatment.

Figure 5D:
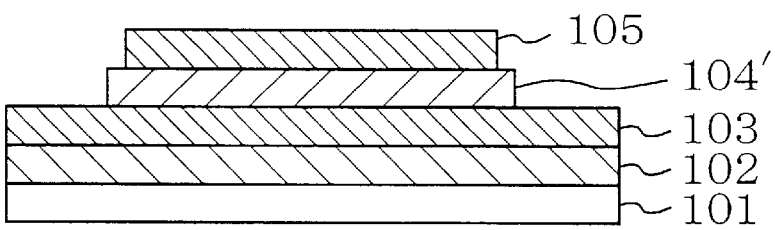
Figure 5E:
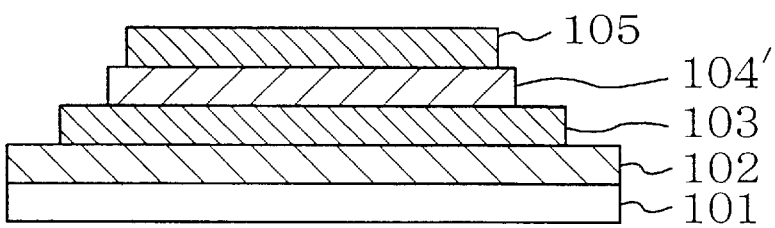

Thereafter, as shown in FIG. 5D, an upper-level electrode layer 105 (thickness: 100 nm) is deposited and patterned on the strontium titanate film 104'. Then, as shown in FIG. 5E, the lower-level electrode layer 103 is patterned to complete a capacitor having a three-level structure consisting of lower-level electrode, capacitive insulating film and upper-level electrode. The lower- and upper-level electrode layers 103, 105 are also patterned by known lithography and etching techniques.

Only a single capacitor is illustrated in FIG. 5E. However, in actuality, a plurality of capacitors may be formed simultaneously on a single epitaxial substrate 101 during this process step.

The same effects as those of the first embodiment can also be attained in this embodiment. In addition, it is possible to suppress the generation of leakage current through (the crystal imperfections of) the wrought face 501 in this embodiment. As a result, a strontium titanate capacitor exhibiting further superior insulating properties can be obtained.

In this embodiment, a heat treatment is conducted before the upper-level electrode layer 105 is deposited and patterned. Alternatively, the heat treatment may be conducted at 450° C. for 10 minutes after the upper-level electrode layer 105 has been patterned. The same effects can be attained in such an alternate embodiment.

Embodiment 3

Hereinafter, an exemplary method for fabricating a semiconductor device (e.g., an MMIC) according to a third embodiment of the present invention will be described with reference to FIGS. 6A through 6I.

Figure 6A:
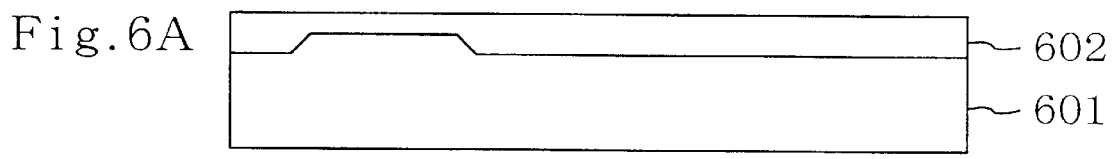
FIGS. 6A through 6I are cross-sectional views illustrating respective process steps for fabricating a semiconductor device according to a third embodiment of the present invention.

First, as shown in FIG. 6A, an insulating protective film 602 is deposited on an epitaxial substrate 601. The structure of the epitaxial substrate 601 may be the same as that illustrated in FIG. 1. It should be noted that no epitaxial layer exists on the surface of the epitaxial substrate 601 in an area where a capacitor is to be formed, but an epitaxial layer is formed on the surface in an area where a field effect transistor (FET) is to be formed. Accordingly, the surface area where an FET is to be formed is at a higher level than that of the other surface areas, i.e., steps are formed on the surface of the epitaxial substrate 601.

Figure 6B:
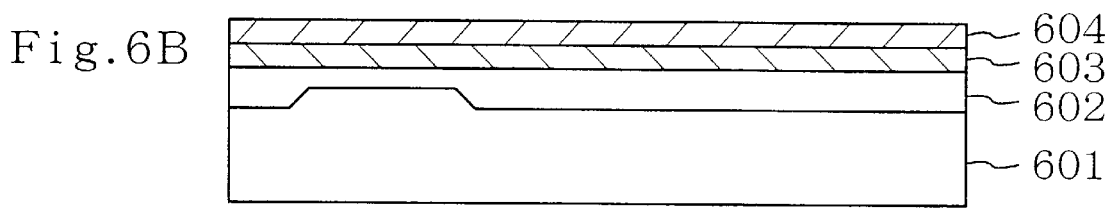

Next, as shown in FIG. 6B, a lower-level metal film 603 and a strontium titanate film 604 are deposited in this order on the protective film 602 and a heat treatment is conducted at 400° C. for 10 minutes.

Figure 6C:
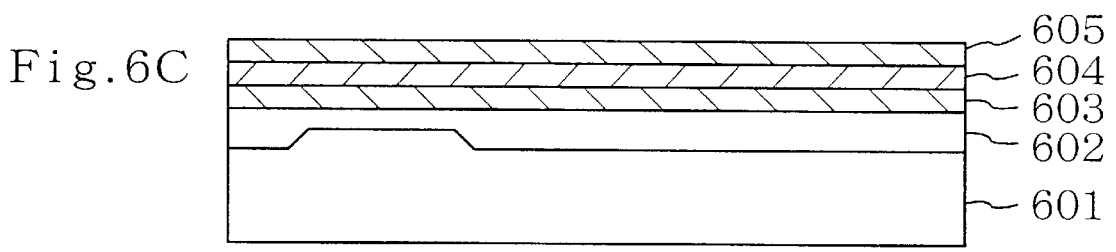
Figure 6D:
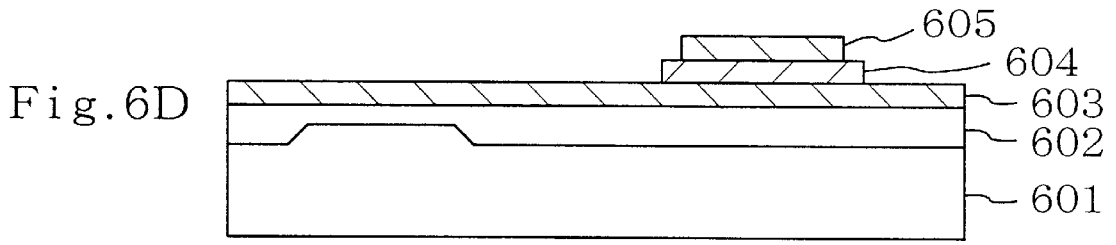
Figure 6E:
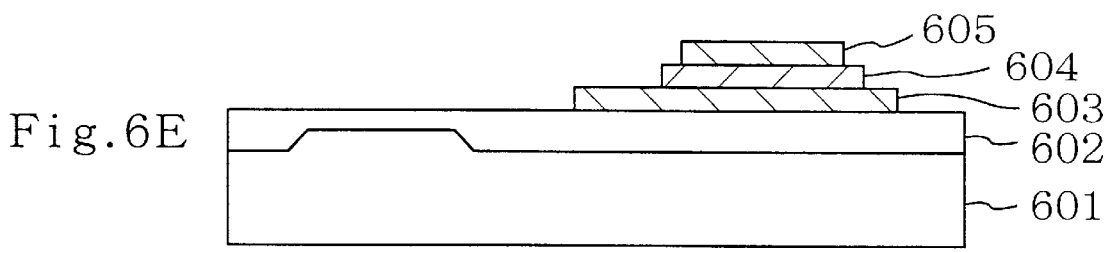

Subsequently, as shown in FIG. 6C, an upper-level metal film 605 is deposited thereon. Then, as shown in FIG. 6D, the upper-level metal film 605 and the strontium titanate film 604 are patterned. And as shown in FIG. 6E, the lower-level metal film 603 is also patterned.

The respective process steps shown in FIGS. 6B through 6E may be performed in the same way as described in the first and second embodiments.

Figure 6F:
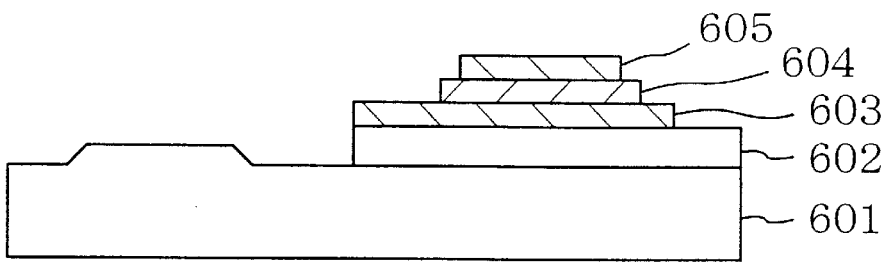
Figure 6G:
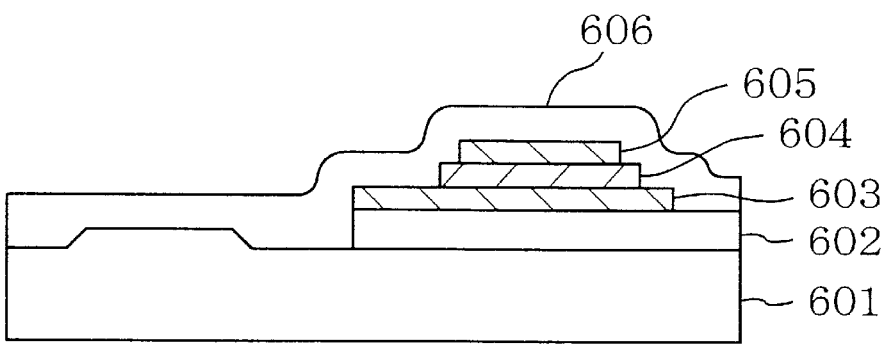
Figure 6H:
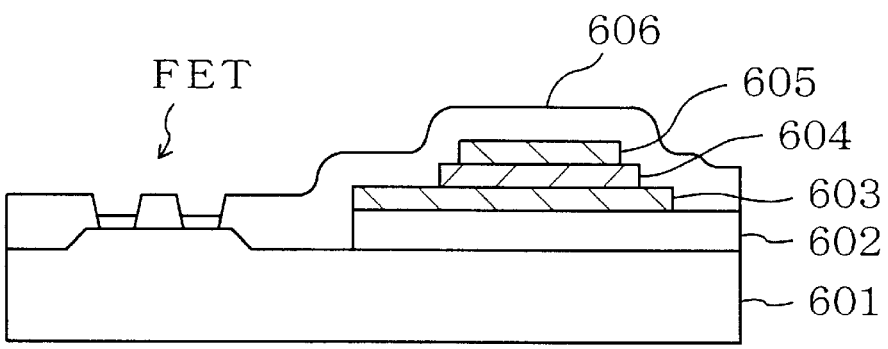
Figure 6I:
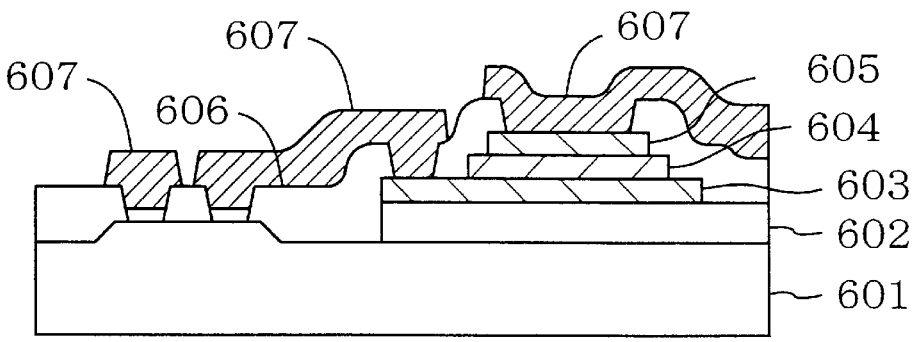

Then, as shown in FIG. 6F, part of the protective film 602, where an FET is to be formed, is removed. Thereafter, as shown in FIG. 6G, the structure shown in FIG. 6F is covered with another protective film 606. Subsequently, as shown in FIG. 6H, an FET is formed in accordance with a known method. During this process step, contact holes are opened through the protective film 606 and then electrodes for making ohmic contacts are formed in these holes. Thereafter, as shown in FIG. 6I, interconnects 607 are formed thereon to connect the lower- and upper-level electrodes 603, 605 of the capacitor to the source/drain regions of the FET and to another circuit component (not shown), respectively. Thereafter, a heat treatment (sintering) for making the contacts ohmic is performed at 400° C. for 1 to 10 minutes, for example.

In this embodiment, the heat treatment for the strontium titanate film 604 is conducted at a temperature approximately equal to that of the heat treatment for making the contacts ohmic.

Figure 7:
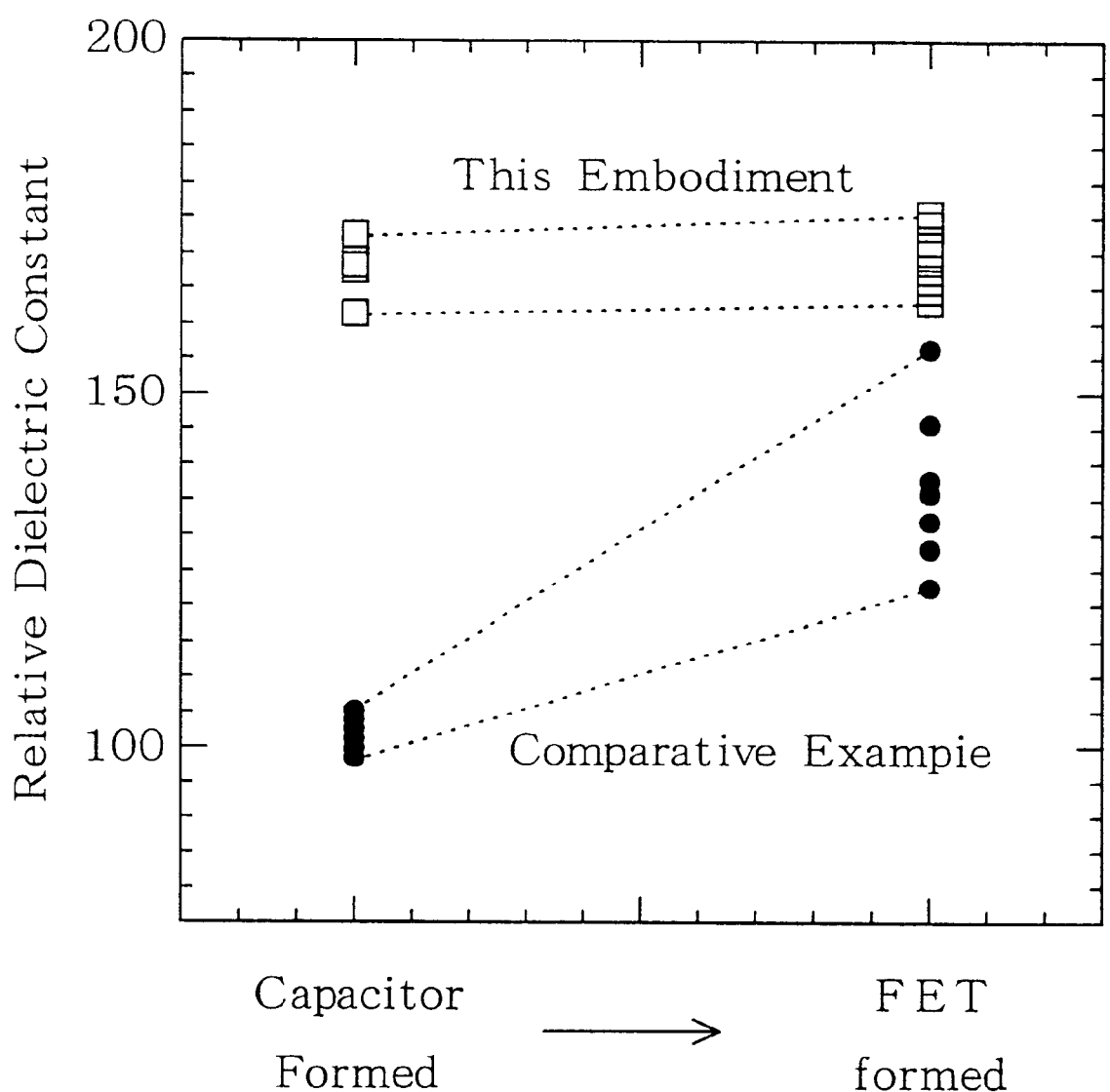
FIG. 7 is a graph illustrating how the relative dielectric constant of a strontium titanate film varies as the fabrication process of a field effect transistor proceeds.

FIG. 7 is a graph illustrating how the relative dielectric constant of the strontium titanate film 604 varies through the respective fabrication process steps. In FIG. 7, the relative dielectric constants are illustrated for both this embodiment and a comparative example. In the comparative example, the heat treatment for the strontium titanate film 604 is omitted.

In this embodiment, a high relative dielectric constant is already attained just after the capacitor has been fabricated. And the relative dielectric constant is substantially constant even after the heat treatment for making the contacts ohmic has been conducted. In addition, the variation among the sampled relative dielectric constants is small. By contrast, in the comparative example, the relative dielectric constant, which was low just after the fabrication of the capacitor, has increased when the heat treatment for making the contacts ohmic is finished. In general, a process of fabricating a field effect transistor includes numerous process steps performed at relatively high temperatures. Among other things, the heat treatment for making the contacts ohmic is conducted at one of the highest temperatures. Accordingly, in the comparative example, even after the capacitor has been fabricated, the relative dielectric constant seems to be gradually increasing to finally reach its maximum value after the heat treatment for making the contacts ohmic has been conducted. Also, in various process steps for fabricating the field effect transistor, the relative dielectric constants are dispersed more greatly. And the ultimate values of the relative dielectric constants are also varied to a larger degree than the embodiment of the present invention.

In accordance with this embodiment, by conducting a heat treatment for the strontium titanate film prior to the fabrication process of the field effect transistor, the relative dielectric constant thereof is increased uniformly and with satisfactory reproducibility. Accordingly, it is possible to prevent the relative dielectric constant from being varied to a large degree during a subsequent heat treatment.

In this case, the temperature of the heat treatment for the strontium titanate film 604 is preferably equal to the maximum temperature of the heat treatment conducted subsequently. In this embodiment, since the heat treatment for making the contacts ohmic is conducted at 400° C., the temperature of the heat treatment for the strontium titanate film is also set at 400° C. If the heat treatment for making the contacts ohmic is conducted at 450° C., then the temperature of the heat treatment for the strontium titanate film is most preferably set at 450° C. Nevertheless, even if these heat treatment temperatures are about 5 to about 10 percent different from each other, the effects of the present invention can be still attained.

In the foregoing embodiments, the present invention has been described as being applied to a strontium titanate film as an exemplary insulating film containing a titanium oxide. Alternatively, an insulating film made of any other material, such as a barium strontium titanate film or a tantalum oxide film, may also be used. And the effects of the present invention can be still attained in those cases. Also, the thicknesses of respective layers specified in the embodiments are not limited to the exemplified ones in any way.

Moreover, in the foregoing embodiments, the present invention has been described as being applied to the formation of a capacitor on an epitaxial substrate. However, the present invention is not limited to such a specific case. Instead, the present invention is broadly and effectively applicable to the formation of an insulating film, containing a titanium oxide, as a capacitive insulating film on a structure having properties deteriorative with a thermal process at more than 400° C. and with the passage of time. The "structures" having thermally deteriorative properties include: semiconductor devices having properties greatly variable with the diffusion of impurities; and various types of devices having properties variable with the thermal variation of crystal structures. In this specification, the "properties" include not only the mobility of carriers, but also various electrical and optical properties such as relative dielectric constant, conductivity, reflectivity and energy band gaps.

As is apparent from the foregoing description, the method of the present invention includes the steps of: depositing an insulating film containing a titanium oxide at a deposition temperature of 400° C. or less; and conducting a heat treatment at a temperature higher than the deposition temperature of the insulating film and lower than 500° C. after the insulating film has been deposited. Accordingly, during the deposition of the insulating film taking a relatively long time, the temperature of the substrate is held relatively low, thereby suppressing the deterioration in properties of the epitaxial substrate. And then sintering is performed as a heat treatment at a temperature higher than the deposition temperature for a shorter period of time. In this manner, the crystallization of the insulating film containing a titanium oxide can be promoted while preventing the properties of the epitaxial substrate from being deteriorated. According to the present invention, a titanium oxide film having a high relative dielectric constant can be formed without deteriorating the properties of an epitaxial substrate. As a result, a capacitor having large capacitance can be formed on a thermally deteriorative substrate such as an epitaxial substrate.

What is claimed is:

1. A method for fabricating a capacitor, said method comprising the steps of:

forming a lower-level electrode layer over a semiconductor structure;

forming an insulating film containing a titanium oxide on the lower-level electrode layer;

conducting a heat treatment on the insulating film at a temperature higher than a temperature used for the formation of the insulating film, the heat treatment being conducted for a period of time shorter than that required for the formation of the insulating film; and forming an upper-level electrode layer on the insulating film.

2. The method of claim 1, wherein:

the heat treatment on the insulating film is conducted prior to the step of forming the upper-level electrode layer.

3. The method of claim 1, wherein:

the step of forming the upper-level electrode layer is conducted prior to the heat treatment on the insulating film, and the method further comprises the step of patterning the upper-level electrode layer so as to have a predetermined configuration between the step of forming the upper-level electrode layer and the heat treatment on the insulating film.

4. The method of claim 1, further comprising the step of patterning the insulating film so as to have a predetermined configuration prior to the heat treatment on the insulating film.

5. The method of claim 1, wherein:

the heat treatment performed on the insulating film is conducted for 5 to 30 minutes, both inclusive.

6. The method of claim 1, wherein:

the heat treatment performed on the insulating film is conducted under an ambient of an inert gas or an oxidizing gas.

7. The method of claim 1, wherein:

the semiconductor structure comprises a semiconductor substrate and a plurality of epitaxially grown layers formed on the semiconductor substrate.

8. The method of claim 7, wherein:

a transistor is formed in the plurality of epitaxially grown layers.

9. The method of claim 7, wherein:

any step conducted after the heat treatment on the insulating film is conducted at a temperature equal to or lower than the temperature used for the heat treatment on the insulating film.

* * * * *